United States Patent
Seino et al.

(10) Patent No.: US 9,281,480 B2
(45) Date of Patent: Mar. 8, 2016

(54) METHOD FOR FORMING PATTERN AND METHOD FOR MANUFACTURING SEMICONDUCTOR DEVICE

(71) Applicant: KABUSHIKI KAISHA TOSHIBA, Tokyo (JP)

(72) Inventors: Yuriko Seino, Tokyo (JP); Naoko Kihara, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/637,558

(22) Filed: Mar. 4, 2015

(65) Prior Publication Data

US 2015/0311442 A1    Oct. 29, 2015

(30) Foreign Application Priority Data

Mar. 20, 2014    (JP) ................................. 2014-059140

(51) Int. Cl.
*H01L 51/00*    (2006.01)

(52) U.S. Cl.
CPC ........ *H01L 51/0012* (2013.01); *H01L 51/0017* (2013.01)

(58) Field of Classification Search
CPC .................................................. H01L 51/0012
USPC .......................................................... 438/703
See application file for complete search history.

(56) References Cited

U.S. PATENT DOCUMENTS

| | | | |
|---|---|---|---|
| 7,521,094 B1 * | 4/2009 | Cheng .................... | B82Y 10/00 427/385.5 |
| 8,636,914 B2 | 1/2014 | Nakamura et al. | |
| 2006/0134556 A1 | 6/2006 | Nealey et al. | |
| 2011/0039061 A1 * | 2/2011 | Fedynyshyn ........ | H01L 21/0337 428/119 |
| 2013/0075360 A1 * | 3/2013 | Nakamura ............. | G03F 7/0002 216/41 |
| 2013/0078570 A1 * | 3/2013 | Hieno ........................ | B32B 7/04 430/270.1 |
| 2013/0183828 A1 * | 7/2013 | Nakamura ................ | G03F 7/40 438/694 |
| 2014/0065839 A1 * | 3/2014 | Kawanishi .......... | H01L 21/0271 438/761 |

FOREIGN PATENT DOCUMENTS

JP    2012-219236    11/2012
JP    2013-073974    4/2013

OTHER PUBLICATIONS

"Dense Self-Assembly on Sparse Chemical Patterns: Rectifying and Multiplying Lithographic Patterns Using Block Copolymers" by Joy Y. Cheng et al.; Advanced Materials; 20, 2008; pp. 3155-3158.

"Interpolation in the Directed Assembly of Block Copolymers on Nanopatterned Substrates: Simulation and Experiments" by François A. Detcheverry et al.; Macromolecules Article; 2010, 43; pp. 3446-3454.

* cited by examiner

*Primary Examiner* — Fernando L Toledo
*Assistant Examiner* — Adam S Bowen
(74) *Attorney, Agent, or Firm* — Nixon & Vanderhye, P.C.

(57) ABSTRACT

In one embodiment, a method for forming pattern includes forming a guide layer on a substrate, forming a copolymer layer of a high-molecular block copolymer on the guide layer; and forming a phase-separation structure with a phase-separation cycle d by self-assembling the copolymer layer. The high-molecular block copolymer includes a first and a second polymer. The guide layer includes a first and a second region disposed on the substrate. Widths of the first and second region respectively are approximately $(d/2) \times n$ and $(d/2) \times m$. Both of the first and second region are to be pinned with none of the first and second polymer. Surface energies of the first and second region are different from one another. Integers n and m are odd numbers. Value d is a phase-separation cycle of the high-molecular block copolymer.

20 Claims, 11 Drawing Sheets

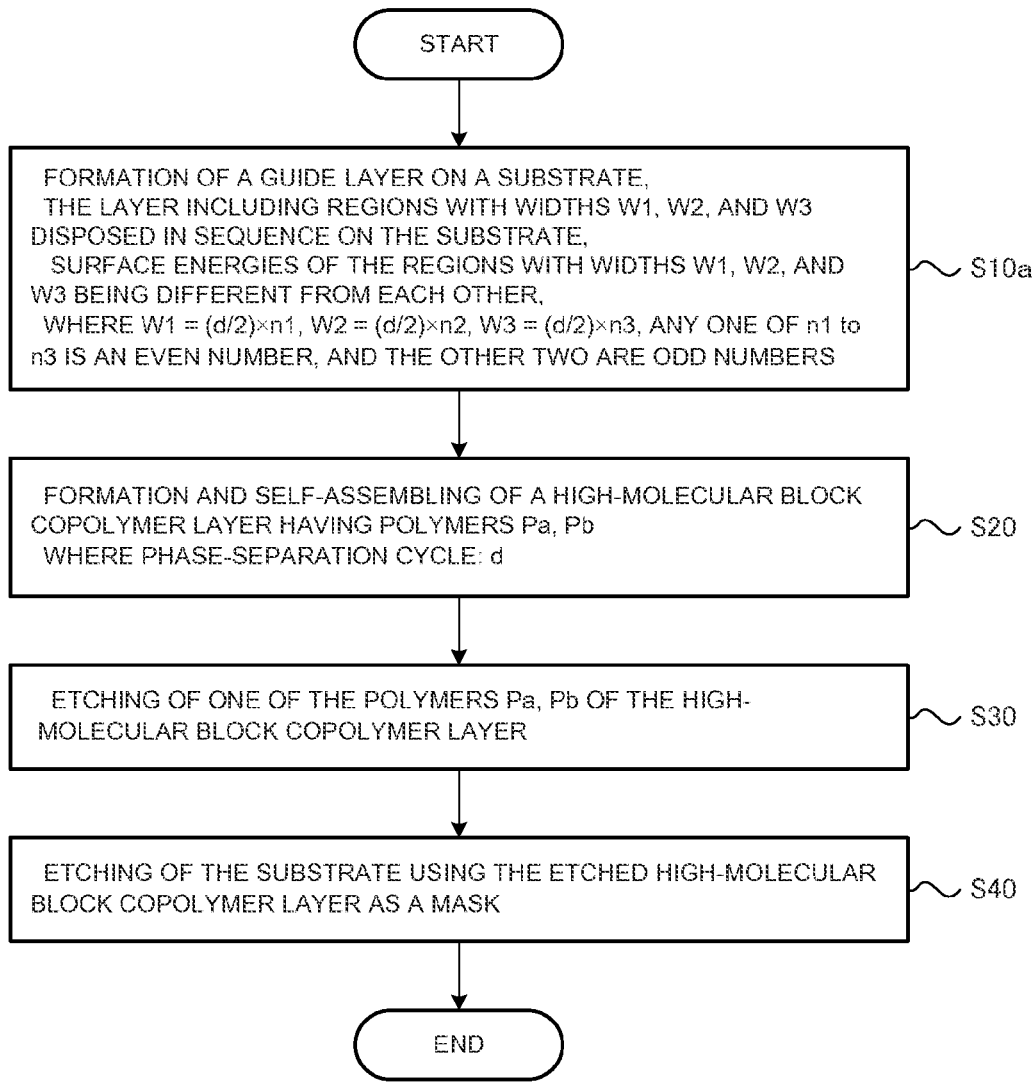

METHOD FOR FORMING PATTERN AND METHOD FOR MANUFACTURING SEMICONDUCTOR DEVICE

CROSS-REFERENCE TO RELATED APPLICATION

This application is based upon and claims the benefit of priority from Japanese Patent Application No. 2014-059140, filed on Mar. 20, 2014; the entire contents of which are incorporated herein by reference.

FIELD

Embodiments described herein relate generally to a method for forming pattern and a method for manufacturing a semiconductor device.

BACKGROUND

High densification of a semiconductor device has been attained by miniaturization of a size of a pattern. This miniaturization has been attained by a lithography technology, in particular, by shortening of wavelength of an exposure light source, but increasing in cost of an exposure device becomes a problem. A double patterning technology in which the pattern created by a conventional exposure device is further miniaturized has been studied, but processes are complicated, and therefore, an inexpensive miniaturization technology has been required.

Therefore, a technology using a block copolymer (BCP) in which plural kinds of polymer blocks are bonded has been studied to correspond to miniaturization of the pattern. The BCP is microphase-separated, aligned in a desired position and direction, and thereby, it is possible to process a substrate while using the above as a template (mask).

As a method to manufacture a line-and-space pattern being one of typical patterns of a semiconductor device, a method using a phase-separation structure of a lamellar or a cylinder from among the microphase-separation modes of the BCP is devised. In particular, a mask function with high aspect is expected for a lamellar structure compared to a cylinder structure. Accordingly, a method arranging the lamellar structure in a desired direction by using a physical guide and a chemical guide has been studied. In particular, according to the chemical guide method, it is possible to seamlessly align a self-assembled pattern at a whole of a desired area, and therefore, it is considered to be a useful method.

In this chemical guide method, it is necessary to form a line pattern whose affinity with one composition of a diblock copolymer is high at a desired line-and-space pattern creation area on the substrate.

At this time, it is necessary to set a width of the chemical guide to be ½ of a self-assembled phase-separation pitch to control a phase-separation alignment without any defect. To create the chemical guide, a conventional photolithography is used, but a most advanced lithography technology is necessary to create the fine chemical guide by using the photolithography, and it is difficult to correspond to further miniaturization request of 10 nm or less.

To avoid these problems, a method to widen the width of the chemical guide to be ½ or more of the self-assembled phase-separation pitch, is devised.

However, in this method, a substrate parallel alignment of lamellar is easy to be induced because a surface energy of the chemical guide is set to be the same as a surface energy of each polymer block in the block copolymer. Namely, reliability of the creation of the line-and-space pattern is lowered.

BRIEF DESCRIPTION OF THE DRAWINGS

FIG. 17 is a flow chart illustrating a method for forming pattern according to a second embodiment.

DETAILED DESCRIPTION

In one embodiment, a method for forming pattern includes forming a guide layer on a substrate, forming a copolymer layer of a high-molecular block copolymer on the guide layer; and forming a phase-separation structure with a phase-separation cycle d by self-assembling the copolymer layer. The high-molecular block copolymer includes a first and a second polymer. The guide layer includes a first and a second region disposed on the substrate. Widths of the first and second region respectively are approximately $(d/2) \times n$ and $(d/2) \times m$. Both of the first and second region are to be pinned with none of the first and second polymer. Surface energies of the first and second region are different from one another. Integers n and m are odd numbers. Value d is a phase-separation cycle of the high-molecular block copolymer.

First Embodiment

Hereinafter, embodiments of the present invention are described with reference to the drawings.

Figure 1:
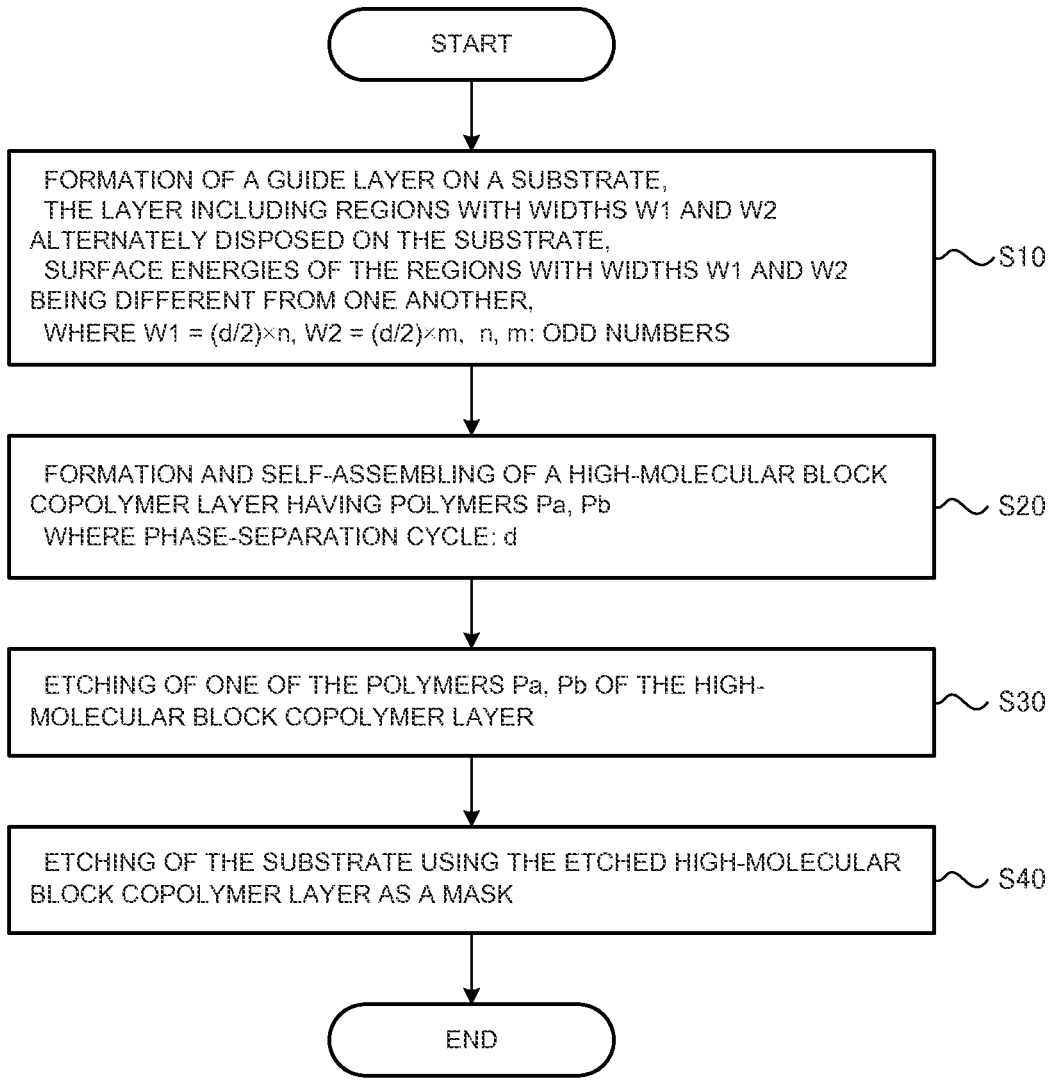
FIG. 1 is a flow chart illustrating a method for forming pattern according to a first embodiment.

FIG. 1 is a flow chart illustrating a method for forming pattern according to a first embodiment. Besides, FIG. 2 to FIG. 13 are top views and side views each illustrating a substrate 11 during pattern forming. Reference signals (a), (b) respectively correspond to the top view and the side view. Note that a hatching is supplied to a polymer Pa so as to easily distinguish between polymers Pa. Pb.

In the present embodiment, the substrate 11 including a guide layer G alternately having regions with a width W1 and regions with a width W2 is created, a high-molecular block copolymer layer BPL is formed on the guide layer G, and it is self-assembled. The self-assembling is a phenomenon in which a structure having an order is autonomously created. Note that the present embodiment can be applied for a method for manufacturing a semiconductor device.

In the present embodiment, a correspondence between the guide layer G and the high-molecular block copolymer layer BPL is important, and therefore, the guide layer G and so on are described before details of the method for forming pattern are described.

Figure 14A:
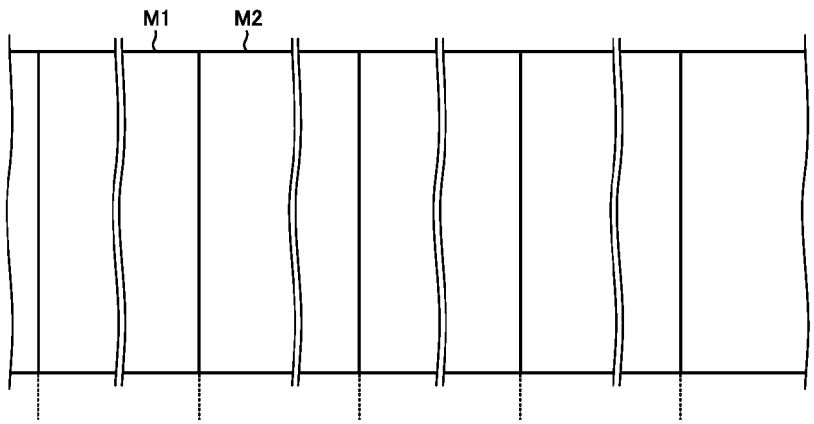
FIGS. 14(a) and 14(b) are a top view and a side view illustrating a guide layer according to the first embodiment.
Figure 14B:
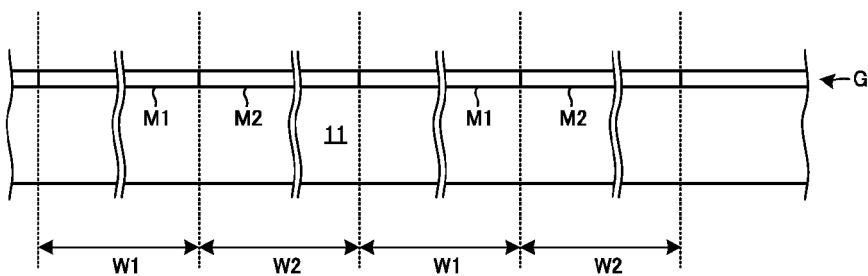
Figure 15A:
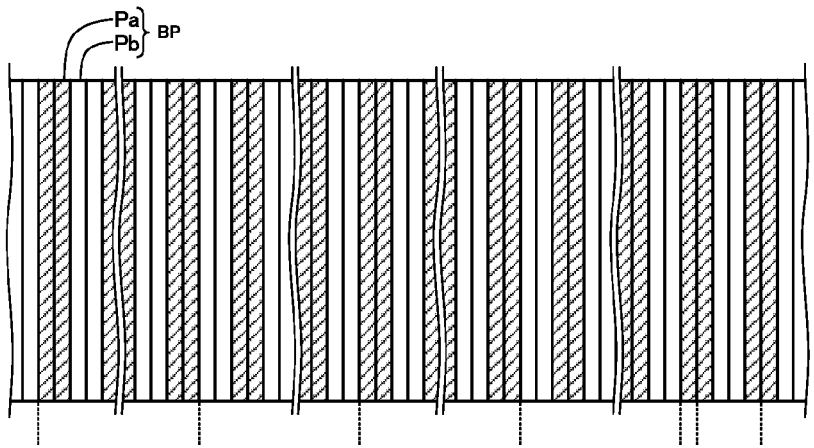
FIGS. 15(a) and 15(b) are a top view and a side view illustrating a correspondence between the guide layer and a high-molecular block copolymer according to the first embodiment.
Figure 15B:
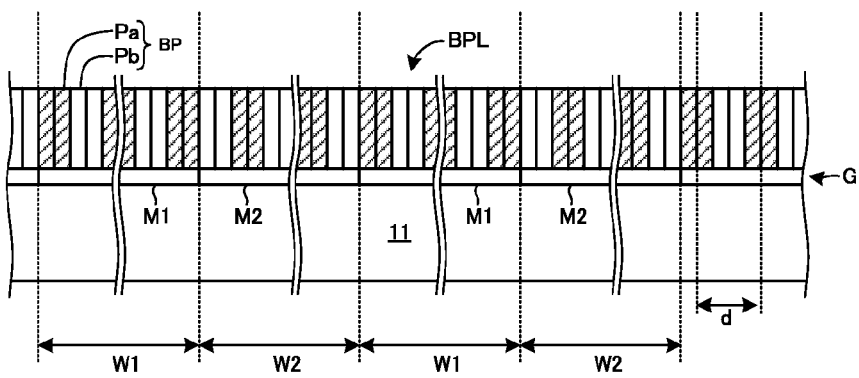

FIG. 14 illustrates the substrate 11 having the guide layer G. Besides, FIG. 15 illustrates a state in which the self-assembled high-molecular block copolymer layer BPL is disposed on the guide layer G.

The high-molecular block copolymer layer BPL is made up of high-molecular block copolymers BP. The high-molecular block copolymer BP is a copolymer of the polymers Pa, Pb. The polymers Pa, Pb respectively function as a first and a second polymer.

The polymers Pa, Pb are, for example, appropriately selected from the following.

Polystyrene (PS), poly-α-methylstyrene, polydimethylsiloxane, polytrimethylsilylstyrene, polymethylmethacrylate (PMMA), poly-4-vinylpyridine, poly-2-vinylpyridine, polyhydroxystyrene, polydimethylsiloxane, polylactide, and polyhydroxyethylmethacrylate.

As the high-molecular block copolymer BP, for example, diblock copolymers and triblock copolymers illustrated as follows can be selected.
Polystyrene (PS)-b-polymethylmethacrylate (PMMA)
Polystyrene-b-poly-4-vinylpyridine
Polystyrene-b-poly-2-vinylpyridine
Poly-α-methylstyrene-b-poly-4-vinylpyridine
Poly-α-methylstyrene-b-poly-2-vinylpyridine
Polystyrene-b-polyhydroxystyrene
Poly-α-methylstyrene-b-polyhydroxystyrene
Polystyrene-b-polydimethylsiloxane
Polydimethylsiloxane-b-polylactide
Polystyrene-b-polyhydroxyethylmethacrylate
Polytrimethylsilylstyrene-b-polylactide
Polytrimethylsilylstyrene-b-polystyrene
Poly-2-vinylpyridine-b-polystyrene-b-poly-2-vinylpyridine
Polystyrene-b-poly-2-vinylpyridine-b-polystyrene
Polylactide-b-polydimethylsiloxane-b-polylactide Here, "b" in "-b-" represents that the polymer is the block copolymer.

When the high-molecular block copolymers BP are self-assembled, the high-molecular block copolymer BP of polymers Pb—Pa is disposed next to the high-molecular block copolymer BP of polymers Pa—Pb resulting from an affinity relationship of the polymers Pa, Pb. The affinities between the polymers Pa with each other, between the polymers Pb with each other are large, but the affinity between the polymer Pa and the polymer Pb is small. As a result, the high-molecular block copolymers BP of the polymers Pa, Pb are arranged such as Pa—Pb, Pb—Pa, Pa—Pb, Pb—Pa, Pa—Pb, Pb—Pa, and so on. Namely, the self-assembled high-molecular block copolymers BP have a phase-separation structure with a cycle (it is also called as a "phase-separation cycle") d, and in case of the lamellar structure, this cycle d corresponds to widths of two phases of the Pa-phase and the Pb-phase of the phase-separated high-molecular block copolymer.

Note that for easy to understanding, in the drawing, a boundary between the Pa-phase and the Pb-phase is denoted by a solid line. However, molecules of the polymer are actually in a complicated state to some extent, and it is not generally divided by a clear boundary. This is the same in the other drawings.

Note that an arrangement of the polymers Pa, Pb is in a lamellar state. Namely, a combination of the polymers Pa, Pb arranged in the lamellar state by the self-assembling and self-assembling conditions is selected.

The guide layer G alternately has the regions with the width W1 (region W1) and the regions with the width W2 (region W2). Note that here, the region and the width thereof correspond, and therefore, reference symbols W1, W2 are used to identify both the regions and the widths thereof.

Surface energies E1, E2 of the respective regions W1, W2 are different from one another. It is to make it function as a guide (chemical guide) to determine a direction of lines generated by the self-assembling and positions of polymer phases in a line-and-space structure when the regions W1, W2 are self-assembled by the high-molecular block copolymers BP. Basically, the high-molecular block copolymers BP are arranged along the boundary of the regions W1, W2. Specifically, the boundary between the polymer Pa phase and the polymer Pb phase is disposed to correspond to the boundary between the regions W1, W2.

The region W1 functions as "a first region whose width is approximately (d/2)×n, and which is not pinned with either the first or second polymer (n: odd number)". Besides, the region W2 functions as "a second region whose surface energy is different from the first region, whose width is approximately (d/2)×m, and which is not pinned with either the first or second polymer (m: odd number)". The details are described later.

Various composing materials can be selected for the guide layer G. As the composing materials of the guide layer G, for example, a random copolymer can be used. The random copolymer is one in which plural monomers are arranged at random, and is able to be formed by mixing and polymerizing plural monomers. The mixed monomers are accidentally polymerized, and thereby, the random copolymer made up by disposing plural monomer components at random is formed. A surface energy of the random copolymer can be appropriately set by making a mixture ratio of the plural monomer components different.

In particular, when the polymers Pa, Pb of the high-molecular block copolymer BP are used for the polymer components of the random copolymer, it becomes easy to make the surface energies E1, E2 of the regions W1, W2 correspond to the arrangement of the self-assembled high-molecular block copolymers BP. The details are described later.

Here, it is preferable that the widths W1, W2 and the surface energies E1, E2 of the regions W1, W2 satisfy the following expression (1) and the expression (2), or the expression (3) with the cycle d of the phase-separation structure of the high-molecular block copolymer BP, and surface energies Ea, Eb of the respective polymers Pa, Pb.

$$W1 = (d/2) \times n$$

$$W2 = (d/2) \times m \qquad \text{expression (1)}$$

Here, integers n, m are odd numbers, and they may be the same or different. Note that the integers n, m may be one, but it is preferably the odd number of three or more to set the widths W1, W2 to be large to some extent.

$$E1 = [Ea \times (n-1)/2 + Eb \times (n+1)/2]/n \quad \text{expression (2)}$$
$$= Ea \times (n-1)/(2n) + Eb \times (n+1)/(2n)$$
$$E2 = Ea \times (m+1)/(2m) + Eb \times (m-1)/(2m)$$

$$E1 = Ea \times (n+1)/(2n) + Eb \times (n-1)/(2n) \quad \text{expression (3)}$$
$$E2 = Ea \times (m-1)/(2m) + Eb \times (m+1)/(2m)$$

Here, the surface energies E1, E2 are each an energy per a unit length, and therefore, in the expressions (2), (3), whole energies at the respective widths W1, W2 are found, and they are divided by the number of lines n, m.

The integers n, m are the odd numbers, and therefore, the numbers of lines of the corresponding polymers Pa phase, Pb phase at the regions W1, W2 are different, and either one phase is one line more in the number of lines of the phase than the other phase.

Besides, as it is already described, the polymers Pa phase, Pb phase are arranged in sequence such as Pa—Pb, Pb—Pa, and Pa—Pb, and therefore, when the number of lines of the polymer Pb phase is larger than the number of lines of the polymer Pa phase in the region W1, the number of lines of the polymer Pb phase becomes smaller than the number of lines of the polymer Pa phase in the region W2.

Note that in the expression (1), an error to some extent is allowed. Originally, it is allowed that the integers n, m vary within a range of, for example, ±0.1 or ±0.2. Namely, the width W1 is allowed as long as it is approximately equal to (d/2)×n.

Otherwise, the widths W1 and W2 determined in a device design are adjustable within a range of ±0.1 or ±0.2 relative to a value calculated from the cycle d of the block copolymer.

The expressions (2), (3) respectively correspond to a case when the number of lines of the polymer Pb phase is larger than the number of lines of the polymer Pa phase, and when it is smaller in the region W1 (when the number of lines of the polymer Pb phase is smaller than the number of lines of the polymer Pa phase, and a case when it is larger in the region W2).

In this case, a state in which the integers n, m are the odd numbers is represented as follows.

It is assumed that the integer n is an even number. In this case, the same number of lines of the polymers Pa phase, Pb phase exist in the region W1. In this case, the surface energy E1 in the region W1 becomes as follows.

$$E1=(Ea+Eb)/2$$

Similarly, the surface energy in the region W2 becomes as follows.

$$E2=(Ea+Eb)/2$$

As stated above, when both of the integers n, m are even numbers, the surface energies E1, E2 of the regions W1, W2 become the same. Namely, the surface energies E1, E2 are constant at both of the regions W1, W2, and it is impossible to arrange the polymers Pa, Pb. To arrange the polymers Pa, Pb, it is necessary that the surface energies E1, E2 of the regions W1, W2 are different.

Both of the integers n, m are set to be the odd numbers, and thereby, one of the polymers Pa, Pb is more than the other by one line. As a result, the surface energies E1, E2 become different from one another, and the arrangements of the polymers Pa, Pb in the regions W1, W2 become possible.

Note that a case when one of the integers n, m is set to be the odd number is described later as a second embodiment.

It is assumed that the number of lines of the polymer Pb phase is larger than the number of lines of the polymer Pa phase by one line in the region W1. Then, the polymer Pb phase is smaller than the polymer Pa phase by one line in the region W2 resulting from cyclic characteristics of the arrangement of the polymers Pa phase, Pb phase. After that, the polymer Pb phase is larger than the polymer Pa phase by one line in the next region W1, and the polymer Pb phase is smaller than the polymer Pa phase by one line in the next region W2. Namely, there is a correspondence between the cyclic characteristics of the polymers Pa phase, Pb phase and the arrangement of the regions W1, W2.

The surface energies of the regions W1, W2 are set as in the expression (2) or (3), and thereby, the arrangement of the polymers Pa, Pb having the surface energies of Ea, Eb and the surface energies of the regions W1, W2 correspond, and the guide of the polymers Pa, Pb by the arrangement of the regions W1, W2 becomes easy.

Here, when the polymers Pa, Pb, the integers n, m are determined, it is preferable to select either of the expressions (2), (3) so that a difference between the surface energies E1, E2 becomes large. The larger the difference between the surface energies E1, E2 is, the larger a possibility in which the polymers Pa, Pb are stably arranged becomes.

As combinations (n, m) of the integers n, m, various values such as (3, 3), (3, 5), (3, 7), (5, 5), (5, 7), (7, 7) can be applied.

Note that when both of the integers n, m become large to some extent, the difference between the surface energies E1, E2 of the regions W1, W2 becomes small. Accordingly, it is preferable that both of the integers n, m are to be, for example, nine or less.

As an example, it is assumed that (n, m)=(5, 7).

At this time, the polymers arranged in the region W1 are either of "three Pa phases+two Pb phases" or "two Pa phases+three Pb phases". Besides, in respective cases of the former and the latter, the polymers arranged in the region W2 are "three Pa phases+four Pb phases", "four Pa phases+three Pb phases". Here, "three Pa phases+two Pb phases" represents that the three lines of the polymer Pa phases and the two lines of the polymer Pb phases are arranged in the region.

At this time, the widths W1, W2 are preferably d×5/2, d×7/2 respectively.

Namely, there can be the following cases (1), (2).
(1) The region W1: "three Pa phases+two Pb phases", the region W2: "three Pa phases+four Pb phases"
(2) The region W1: "two Pa phases+three Pb phases", the region W2: "four Pa phases+three Pb phases"

At this time, the random copolymer of the polymers Pa, Pb can be selected for the guide layer G. It is possible to use the random copolymers whose compounding ratios of the polymers Pa, Pb are respectively "3:2" and "3:4" for the regions W1, W2.

For example, in a semiconductor device, a positional relationship between the lines of the Pa phases and the Pb phases is important when the line-and-space pattern is created. In the present embodiment, the surface energies E1, E2 of the widths W1, W2 are set to be intermediate values of the surface energies Ea, Eb of the polymers Pa phase, Pb phase, and values distinguishable from one another to make clear the positional relationship.

Besides, conditions in themselves of the expressions (2), (3) have ranges to some extent. Namely, originally, it is allowed that the integers n, m vary within a range of, for example, ±0.1 or ±0.2. Namely, the surface energy E1 is allowed as long as it is approximately equal to "Ea×(n−1)/(2n)+Eb×(n+1)/(2n)".

Besides, in the present embodiment, both of the regions W1, W2 on the guide layer G are not pinned with either of the polymers Pa, Pb. Accordingly, the lamellar phase-separation structure is difficult to be aligned in a direction in parallel to a main surface of the substrate 11 (stability in arrangement), and reliability of the creation of the line-and-space pattern improves.

Hereinafter, the details of the method for forming pattern in the embodiment are described. In the present embodiment, the pattern is formed by the following procedure.

Here, a case when PS, PMMA are used as the polymers Pa, Pb, and when n=5, m=7 is described as an example. A phase-separation cycle of the PS-PMMA is set to be d=26 nm.

At this time, the widths W1, W2 are as follows.

$$W1 = d \times n/2 = 26 \times 5/2 = 65 \text{ nm}$$

$$W2 = d \times m/2 = 26 \times 7/2 = 91 \text{ nm}$$

A. Formation of Guide Layer G Alternately Having Regions W1, W2 (Step S10, Refer to FIG. 2 to FIG. 7)

The guide layer G alternately having the regions W1, W2 is formed on the substrate 11.

Figure 2A:
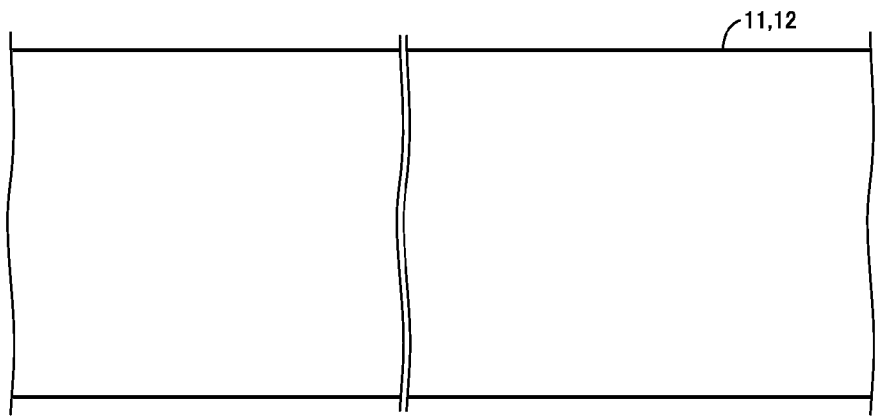
FIGS. 2(a) and 2(b) are a top view and a side view illustrating a substrate during the pattern forming.
Figure 2B:
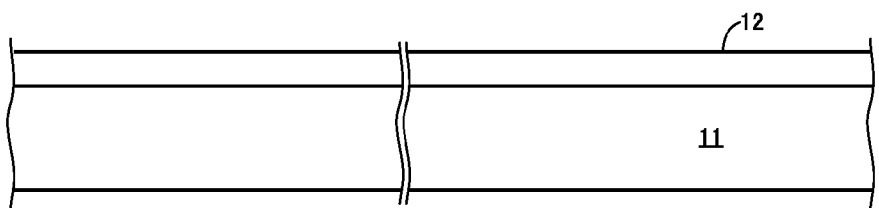

(1) Preparation of Substrate 11 (Refer to FIG. 2)

The substrate 11 is prepared. As the substrate 11, for example, a silicon substrate can be used. Here, it is preferable to firmly bond the substrate 11 with the guide layer G. Accordingly, a copolymer bonding layer (pinning layer) 12 which is bonded (pinning) to the guide layer G is formed at the substrate 11. For example, an $SiO_2$ film can be used for the copolymer bonding layer 12. As it is described later, a material having a hydroxyl group and so on is used for the guide layer G, and thereby, it is possible to bond the guide layer G to the $SiO_2$ film.

As stated above, for example, the silicon substrate where the $SiO_2$ film with the thickness of 20 nm is formed can be used as a combination of the substrate 11 and the copolymer bonding layer (pinning layer) 12. The $SiO_2$ film can be formed by using appropriate methods such as thermal oxidation and sputtering. Besides, so-called as an SOG substrate using an SOG (Spin on Glass) may be used as the silicon substrate where the $SiO_2$ film is formed.

(2) Formation of Guide Layer G (Refer to FIG. 3 to FIG. 7)

The guide layer G having the regions W1, W2 is formed.

Here, material layers M1, M2 are formed, patterned, to thereby form the guide layer G.

Figure 3A:
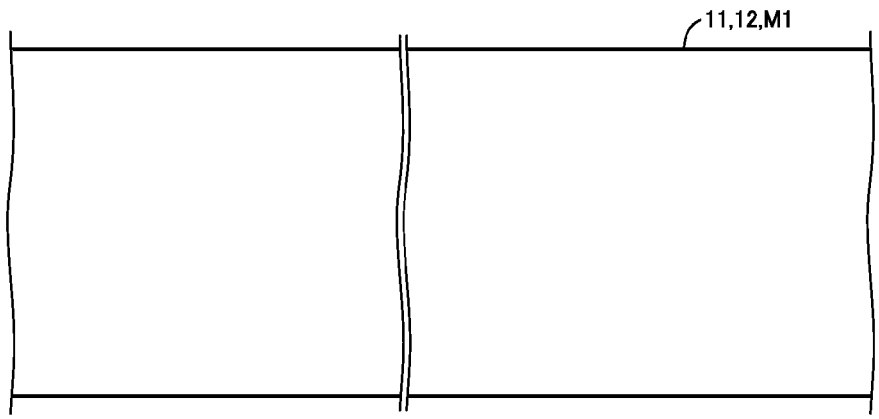
FIGS. 3(a) and 3(b) are the top view and the side view illustrating the substrate during the pattern forming.
Figure 3B:
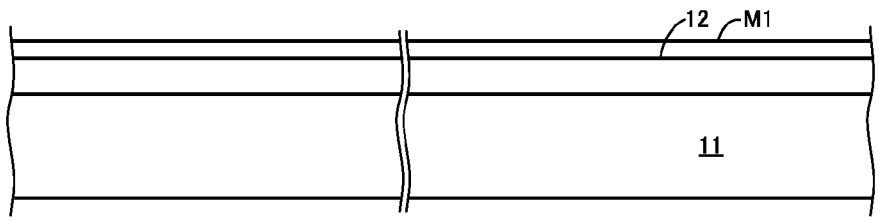

1) Formation of Material Layer M1 (Refer to FIG. 3)

For example, the material layer M is formed on the copolymer bonding layer 12 as described below.

The PS-PMMA random copolymer (PS:PMMA=6:4) having the hydroxyl group at an end (material M1) is coated. For example, after a heat treatment is performed for three minutes on a hot plate at 210° C., spin cleaning is performed by a solvent (PGMEA), and a graft film (material layer M1) of the PS-PMMA (material M1) is created on the copolymer bonding layer 12. Note that the spin cleaning is to remove the material M1 which is not bonded (anchoring) to the copolymer bonding layer 12.

Figure 4A:
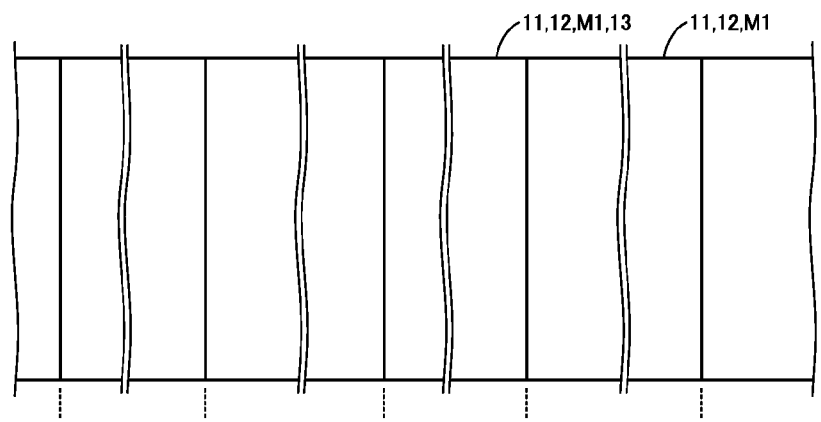
FIGS. 4(a) and 4(b) are the top view and the side view illustrating the substrate during the pattern forming.
Figure 4B:
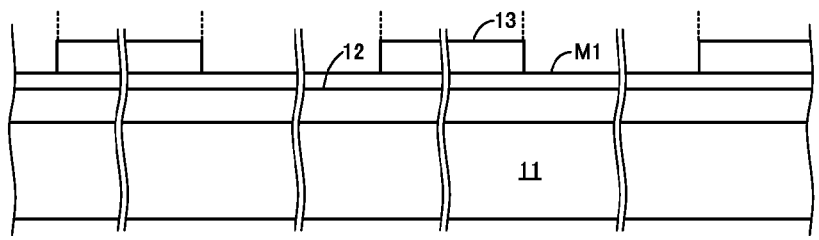
Figure 5A:
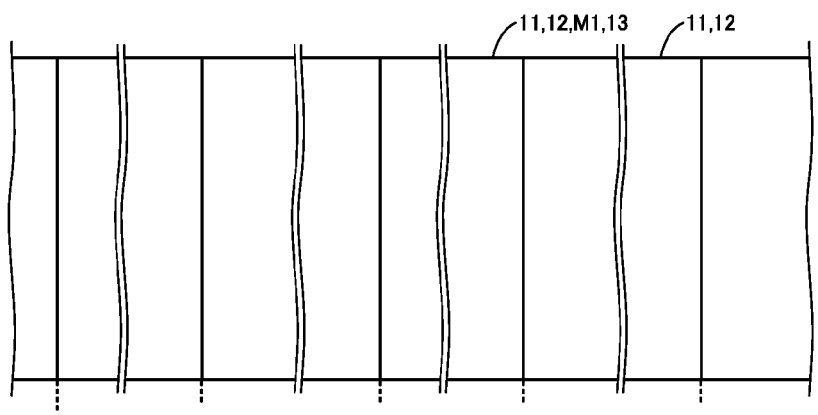
FIGS. 5(a) and 5(b) are the top view and the side view illustrating the substrate during the pattern forming.
Figure 5B:
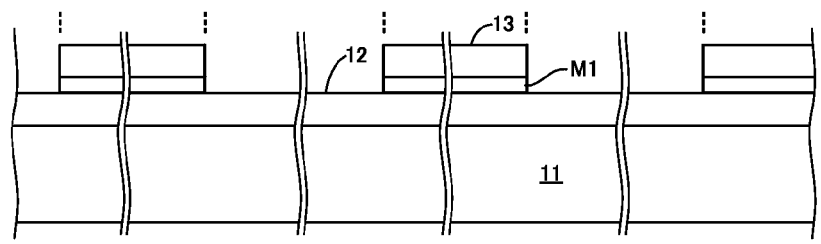

2) Patterning of Material Layer M1 (Refer to FIG. 4 to FIG. 5)

For example, a mask is formed on the copolymer bonding layer 12 as described below to perform the patterning of the material layer M1.

Formation of Mask (Refer to FIG. 4)

A resist layer 13 is formed on the material layer M1. For example, a positive-type ArF resist is coated on the material layer M1. After that, the resist layer 13 is exposed and developed, and thereby, a pattern with 65 nm (=width W1) lines and 91 nm spaces (=width W2) is created.

Patterning of Material Layer M1 (Refer to FIG. 5)

The material layer M1 exposed from the developed resist layer 13 is removed by etching (for example, oxygen etching). As a result, the width W2 space in which the copolymer bonding layer 12 is exposed can be created.

Figure 6A:
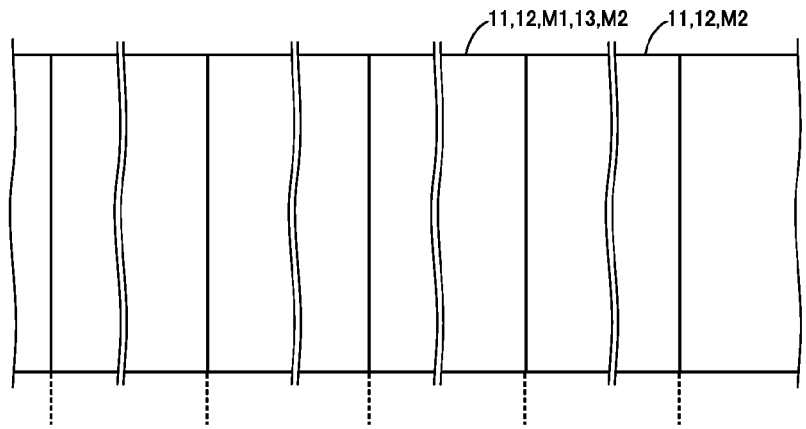
FIGS. 6(a) and 6(b) are the top view and the side view illustrating the substrate during the pattern forming.
Figure 6B:
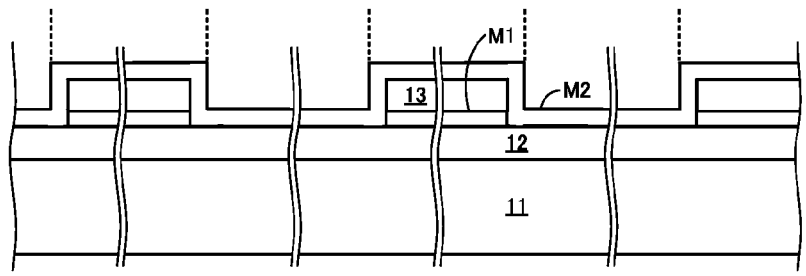

3) Formation of Material Layer M2 (Refer to FIG. 6)

For example, the material layer M2 is formed on the exposed copolymer bonding layer 12 as described below.

A PS-PMMA random copolymer (PS:PMMA=4:3) having the hydroxyl group at an end (material M2) is coated. For example, after the heat treatment is performed for three minutes on the hot plate at 210° C., the spin cleaning is performed by the solvent (PGMEA), and a graft film (material layer M2) of the PS-PMMA (material M2) is created on the copolymer bonding layer 12.

Figure 7A:
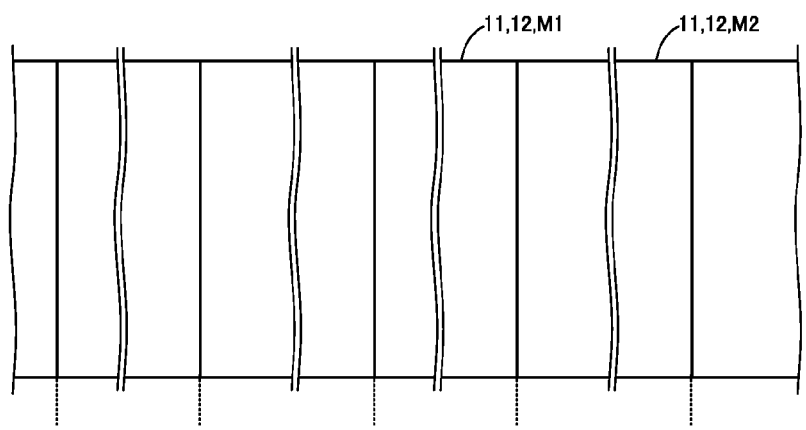
FIGS. 7(a) and 7(b) are the top view and the side view illustrating the substrate during the pattern forming.
Figure 7B:
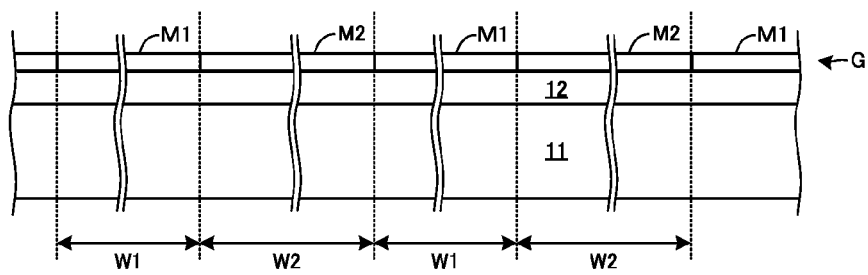
Figure 8A:
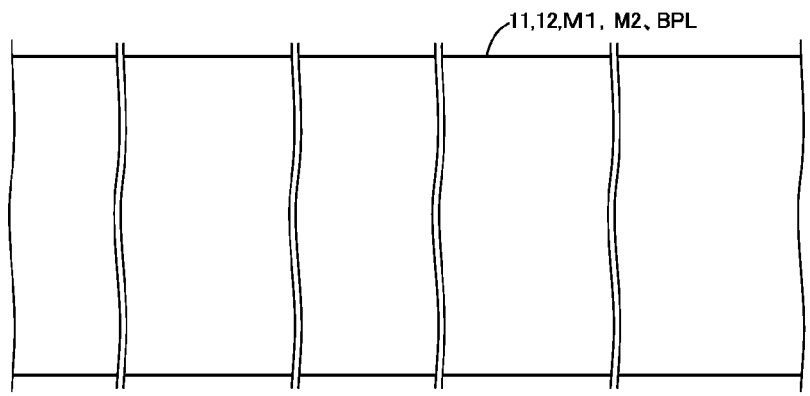
FIGS. 8(a) and 8(b) are the top view and the side view illustrating the substrate during the pattern forming.
Figure 8B:
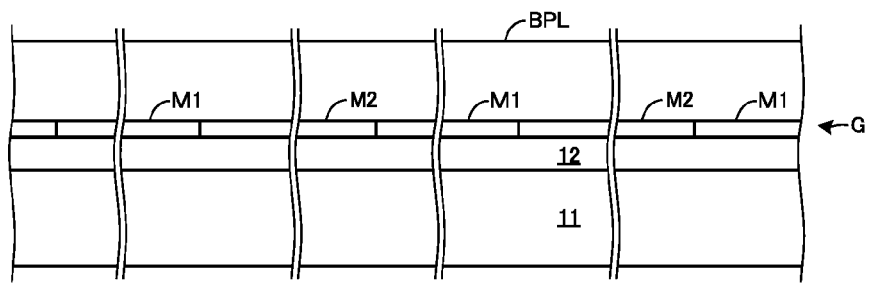

4) Patterning of Material Layer M2 (Refer to FIG. 7)

For example, the substrate 11 is immersed in a resist stripping solution to remove the patterned resist layer 13 (resist pattern). As a result, an alternate line pattern of the graft films of the PS-PMMA (material M1) and the PS-PMMA (material M2) can be formed by a lift-off.

B. Formation and Self-Assembling of High-Molecular Block Copolymer Layer (Step S20, Refer to FIG. 8 to FIG. 9)

The high-molecular block copolymer layer BPL is formed on the guide layer G, and is self-assembled. By the self-assembling, the high-molecular block copolymers BP are disposed in a line state at the copolymer layer BPL.

Figure 9A:
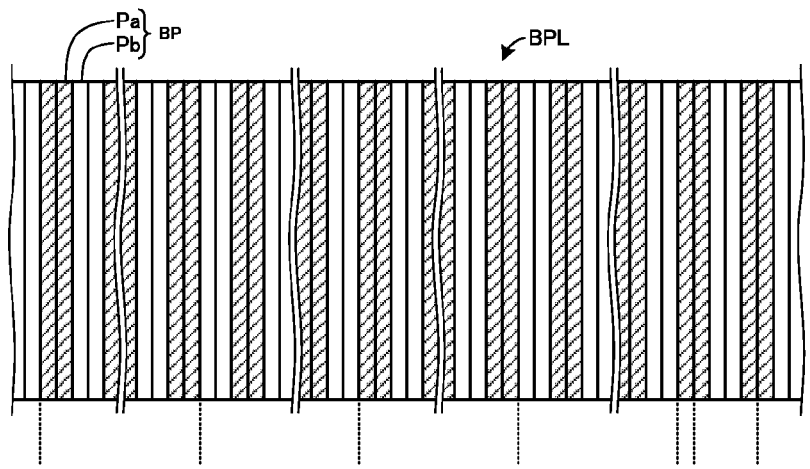
FIGS. 9(a) and 9(b) are the top view and the side view illustrating the substrate during the pattern forming.
Figure 9B:
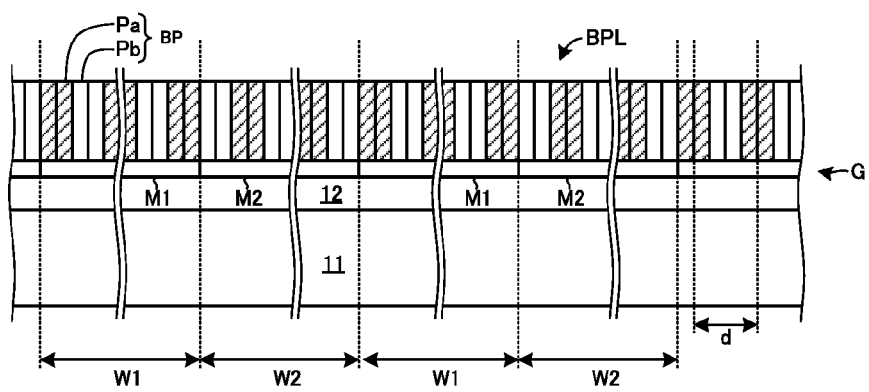
Figure 10A:
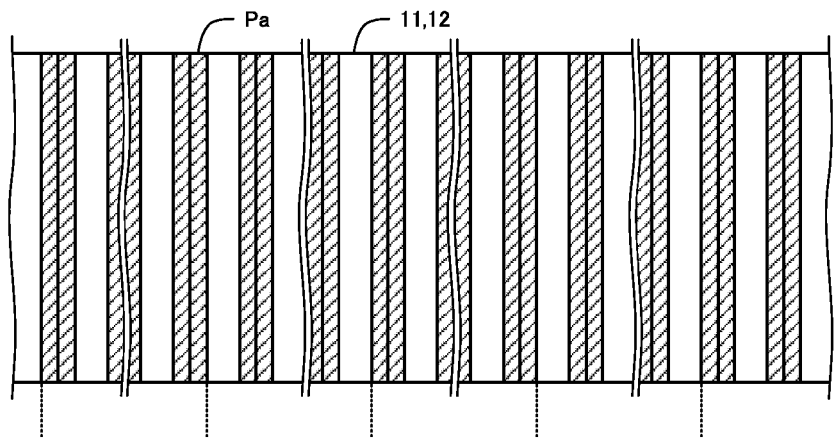
FIGS. 10(a) and 10(b) are the top view and the side view illustrating the substrate during the pattern forming.
Figure 10B:
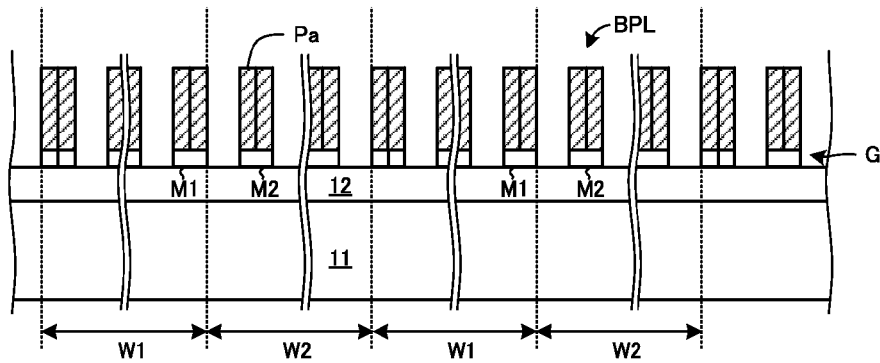

For example, the block copolymer BP made up of PS:PMMA (1:1) is coated on the substrate 11 (refer to FIG. 8), it is heat-treated for two minutes on the hot plate at 200° C. to thereby obtain a phase-separation pattern (refer to FIG. 9).

C. Etching of High-Molecular Block Copolymer Layer BPL (Step S30, Refer to FIG. 10)

The self-assembled high-molecular block copolymer layer BPL is etched. For example, the PMMA phase is removed by the oxygen etching.

D. Etching of Substrate 11 (Step S40, Refer to FIG. 11 to FIG. 13)

The copolymer bonding layer 12 and the substrate 11 are etched while using the etched copolymer bonding layer 12 as a mask. Specifically, the copolymer bonding layer 12, the substrate 11 are etched in sequence as described below.

Figure 11A:
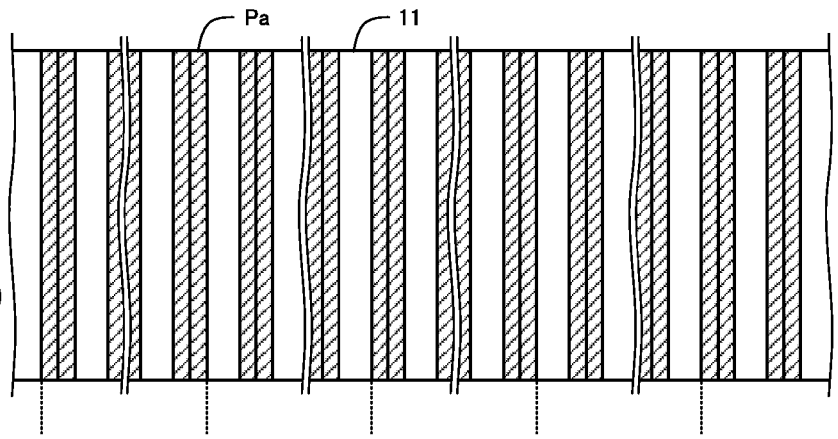
FIGS. 11(a) and 11(b) are the top view and the side view illustrating the substrate during the pattern forming.
Figure 11B:
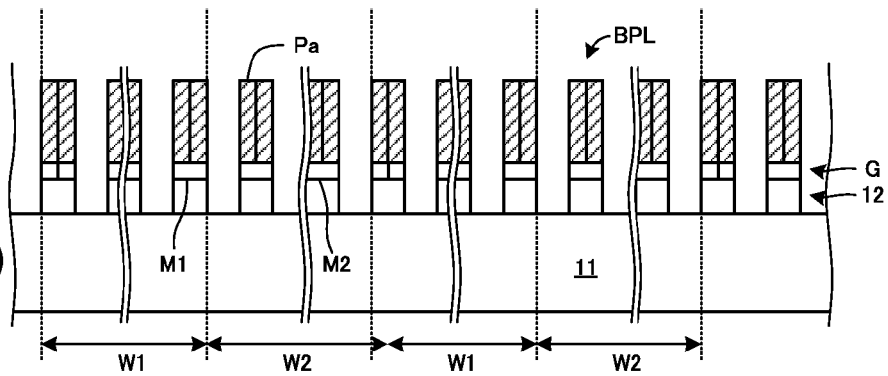

(1) Etching of Copolymer Bonding Layer 12 (Refer to FIG. 11)

The etched high-molecular block copolymer layer BPL is used as a mask, and the copolymer bonding layer 12 ($SiO_2$ film) is etched by using, for example, $CHF_3$ gas.

Figure 12A:
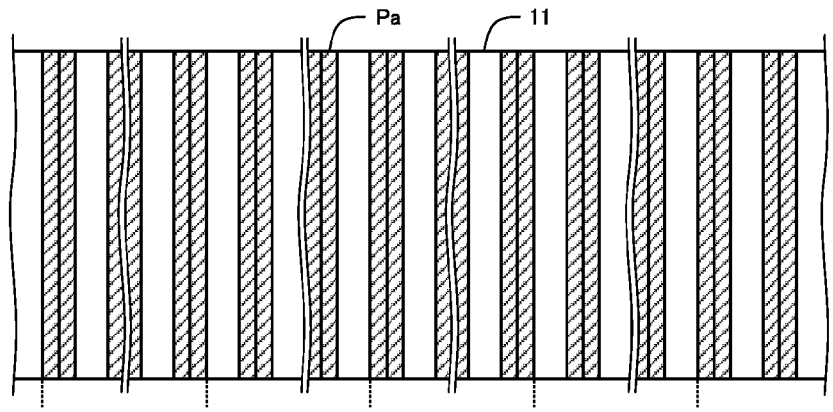
FIGS. 12(a) and 12(b) are the top view and the side view illustrating the substrate during the pattern forming.
Figure 12B:
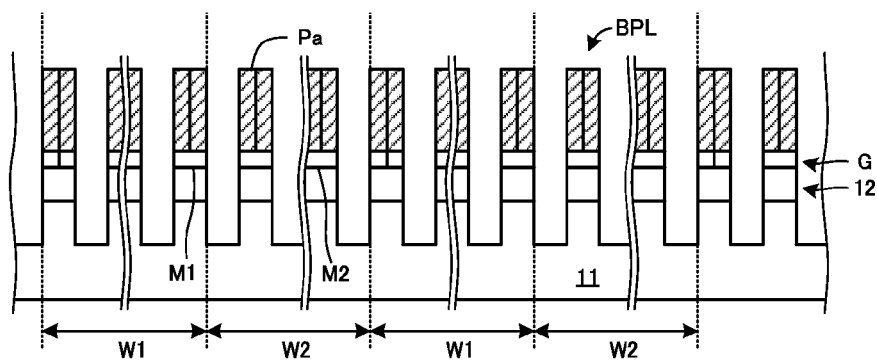
Figure 13A:
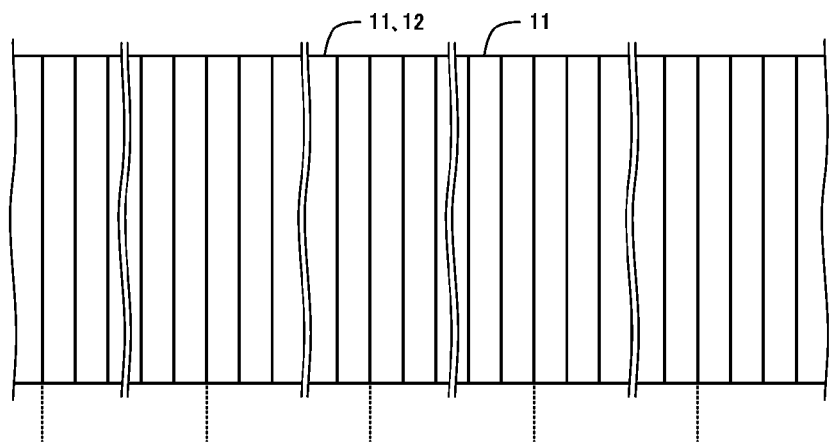
FIGS. 13(a) and 13(b) are the top view and the side view illustrating the substrate during the pattern forming.
Figure 13B:
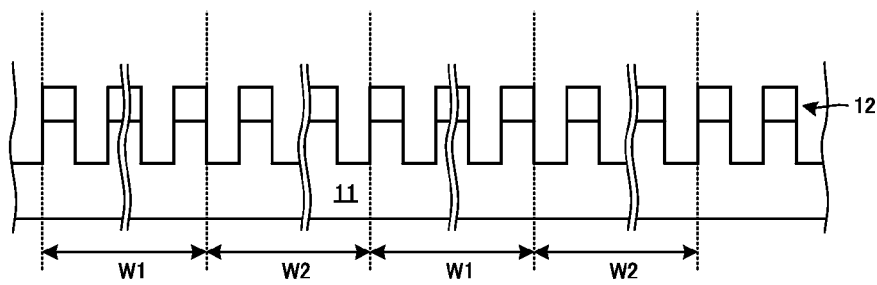

(2) Etching of Substrate 11 (Refer to FIG. 12 to FIG. 13)

The etched copolymer bonding layer 12 is used as a mask, and the substrate 11 is etched while using 1:1 mixed gas of, for example, $SF_6$ and oxygen. As a result, the line-and-space pattern of 13 nm is obtained.

Comparative Example

Comparative examples will be described.

Figure 16A:
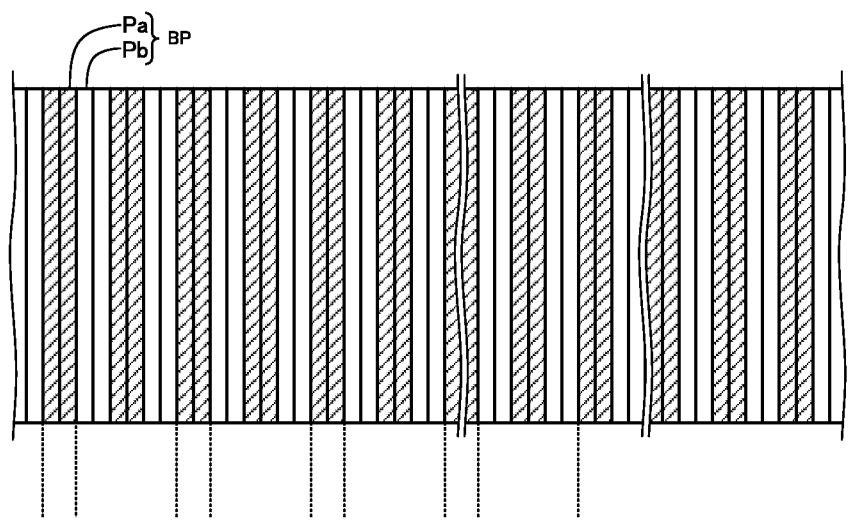
FIGS. 16(a) and 16(b) are a top view and a side view illustrating a correspondence between a guide layer and a high-molecular block copolymer according to a comparative example.
Figure 16B:
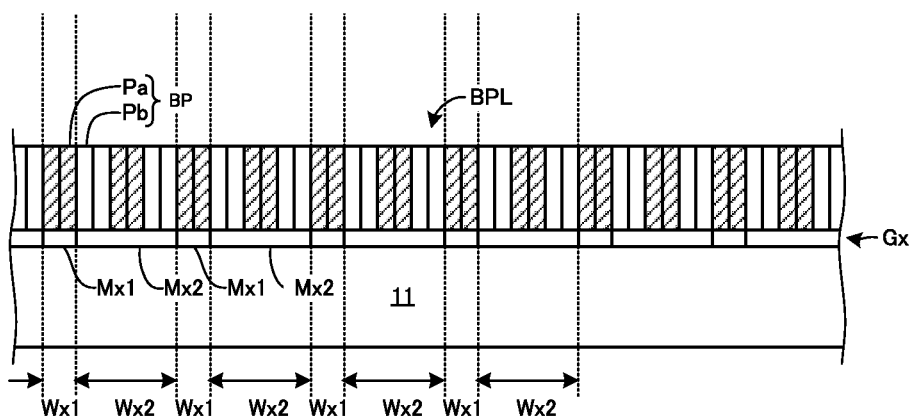

FIG. 16 illustrates a state in which the self-assembled high-molecular block copolymer layer BPL is disposed on a guide layer Gx, and it corresponds to FIG. 15.

In the guide layer Gx, regions with a width W×1 (=(½) d) and regions with a width W×2 (=nd) are alternately disposed. The region with the width W×1 has affinity for the polymer Pa, and the polymer Pa is pinned. The region with the width W×2 has neutral affinity for the polymers Pa, Pb, and neither of the polymers Pa, Pb are pinned.

As a result, the self-assembled high-molecular block copolymer layer BPL is pinned, and arranged by the region with the width W×1 (=½d).

However, the width of the region with the width W×1 is ½ of the phase-separation cycle d, and therefore, processing accuracy by the lithography, and so on is required.

On the other hand, in the embodiment, it is possible to make the widths larger than the phase-separation cycle d in both of the regions with the widths W1, W2. Specifically, when the line-and-space pattern is created by using the BCP of the lamellar phase-separation, it is possible to make a chemical guide width for arrangement control of a microphase separation to be 3/2 times or more of the phase-separation cycle d (when n, m are set to be three or more).

As stated above, in the embodiment, it is possible to reduce the requirement for the processing accuracy of a pre-pattern creation (chemical guide creation).

Besides, as stated above, the lamellar phase-separation structure is difficult to be aligned in a direction in parallel to the main surface of the substrate 11 (stabilization of arrangement), and the reliability of the creation of the line-and-space pattern improves. Namely, the arrangement is stabilized, and the reliability of the pattern creation improves.

Second Embodiment

The second embodiment of the present invention is described.

Figure 18A:
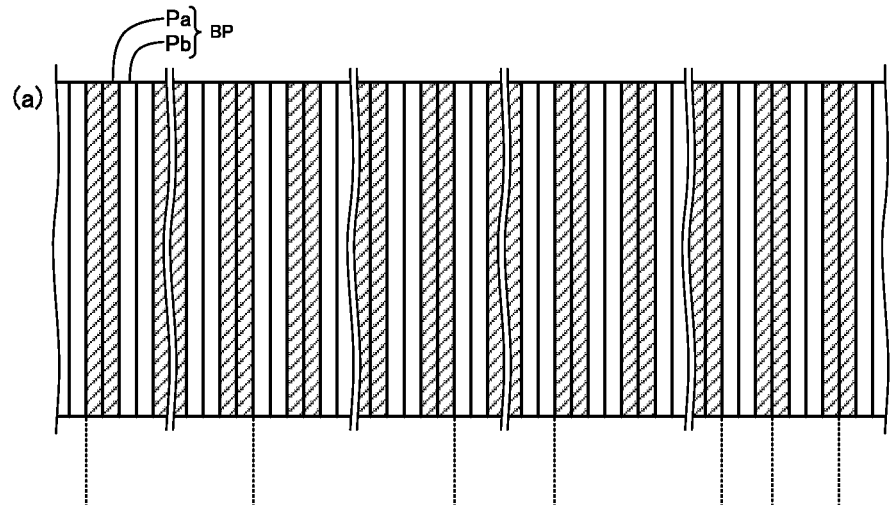
FIGS. 18(a) and 18(b) are a top view and a side view illustrating a correspondence between a guide layer and a high-molecular block copolymer according to the second embodiment.
Figure 18B:
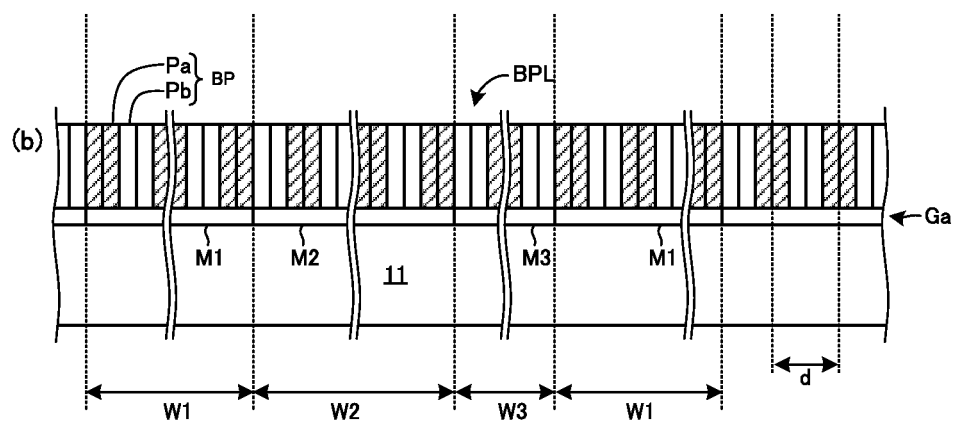

FIG. 17 is a flow chart illustrating a method for forming pattern according to the second embodiment. Besides, FIG. 18 illustrates a state in which the self-assembled high-molecular block copolymer layer BPL is disposed on a guide layer Ga, and it corresponds to FIG. 15. FIG. 16.

In the guide layer Ga, regions with widths W1, W2, W3 are cyclically arranged.

At this time, the widths W1 to W3 of the regions W1 to W3 preferably correspond to the cycle d of the phase-separation structure of the high-molecular block copolymer BP as follows.

$$W1=(d/2) \times n1$$

$$W2=(d/2) \times n2$$

$$W3=(d/2) \times n3 \quad \text{expression (11)}$$

Here, one of n1 to n3 is an even number, and the other two are odd numbers. The two odd numbers may be the same or different. Note that the two odd numbers may be one, but it is preferable to be the odd number of three or more so as to set the widths W1 to W3 to be large to some extent.

Thereby, it is possible to make surface energies of the regions W1 to W3 different, and to correspond to the arrangement of the polymers Pa, Pb. Note that in this method, formations and etchings of three material layers M1 to M3 become necessary to form the regions W1 to W3 in step S10a in FIG. 17.

The present embodiment is common to the first embodiment in other points, and therefore, detailed description is not given.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for forming a pattern using a high-molecular block copolymer including a first polymer and a second polymer, the method comprising:
    forming a guide layer on a substrate, the guide layer including a first region and a second region disposed on the substrate, widths of the first and second regions respectively being approximately $(d/2) \times n$ and $(d/2) \times m$, both of the first and second regions to be pinned with none of the first and second polymer, and surface energies of the first and second regions being different from one another, where n, m: odd number, and d: a phase-separation cycle of the high-molecular block copolymer;
    forming a copolymer layer of the high-molecular block copolymer on the guide layer; and
    forming a phase-separation structure with the phase-separation cycle d by self-assembling the copolymer layer.

2. The method for forming a pattern of claim 1, wherein integers n and m are three or more.

3. The method for forming a pattern of claim 1, wherein the phase-separation structure is a lamellar phase-separation structure.

4. The method for forming a pattern of claim 1, wherein the first and second polymers respectively have surface energies Ea, Eb different from one another, the surface energy of the first region is approximately $(Ea \times (n-1)/(2n)+Eb \times (n+1)/(2n))$, and the surface energy of the second region is approximately $(Ea \times (m+1)/(2m)+Eb \times (m-1)/(2m))$.

5. The method for forming a pattern of claim 1, wherein the first and second polymers respectively have surface energies Ea, Eb different from one another, the surface energy of the first region is approximately $(Ea \times (n+1)/(2n)+Eb \times (n-1)/(2n))$, and the surface energy of the second region is approximately $(Ea \times (m-1)(2m)+Eb \times (m+1)/(2m))$.

6. The method for forming a pattern of claim 1, wherein the guide layer is a random polymer of the first and second polymers.

7. The method for forming a pattern of claim 6, wherein composition ratios of the first and second polymers at the first and second regions are different from one another.

8. The method for forming a pattern of claim 7, wherein the composition ratio of the first and second polymers at the first region is approximately $(n-1):(n+1)$, and the composition ratio of the first and second polymers at the second region is approximately $(m+1):(m-1)$.

9. The method for forming a pattern of claim 7, wherein the composition ratio of the first and second polymers at the first region is approximately $(n+1):(n-1)$, and the composition ratio of the first and second polymers at the second region is approximately $(m-1):(m+1)$.

10. The method for forming a pattern of claim 1, wherein the guide layer includes a plurality of the first regions and a plurality of the second regions alternately disposed on the substrate.

11. A method for manufacturing a semiconductor device using a high-molecular block copolymer including a first polymer and a second polymer, the method comprising:

forming a guide layer on a substrate, the guide layer including a first region and a second region disposed on the substrate, widths of the first and second regions respectively being approximately $(d/2) \times n$ and $(d/2) \times m$, both of the first and second regions to be pinned with none of the first and second polymers, and surface energies of the first and second regions being different from one another, where n, m: odd number, and d: a phase-separation cycle of the high-molecular block copolymer;

forming a copolymer layer of the high-molecular block copolymer on the guide layer;

forming a phase-separation structure with the phase-separation cycle d by self-assembling the copolymer layer;

etching one of the first and second polymers of the self-assembled copolymer layer; and etching the substrate using the etched copolymer layer as a mask.

12. The method for manufacturing the semiconductor device of claim 11,
wherein integers n and m are three or more.

13. The method for manufacturing the semiconductor device of claim 11,
wherein the phase-separation structure is a lamellar phase-separation structure.

14. The method for manufacturing the semiconductor device of claim 11,
wherein the first and second polymers respectively have surface energies Ea, Eb different from one another,
the surface energy of the first region is approximately $(Ea \times (n-1)/(2n) + Eb \times (n+1)/(2n))$, and
the surface energy of the second region is approximately $(Ea \times (m+1)/(2m) + Eb \times (m-1)/(2m))$.

15. The method for manufacturing the semiconductor device of claim 11,
wherein the first and second polymers respectively have surface energies Ea, Eb different from one another,
the surface energy of the first region is approximately $(Ea \times (n+1)/(2n) + Eb \times (n-1)/(2n))$, and
the surface energy of the second region is approximately $(Ea \times (m-1)/(2m) + Eb \times (m+1)/(2m))$.

16. The method for manufacturing the semiconductor device of claim 11,
wherein the guide layer is a random polymer of the first and second polymers.

17. The method for manufacturing the semiconductor device of claim 16,
wherein composition ratios of the first and second polymers at the first and second regions are different from one another.

18. The method for manufacturing the semiconductor device of claim 17,
wherein the composition ratio of the first and second polymers at the first region is approximately $(n-1):(n+1)$, and
the composition ratio of the first and second polymers at the second region is approximately $(m+1):(m-1)$.

19. The method for manufacturing the semiconductor device of claim 17,
wherein the composition ratio of the first and second polymers at the first region is approximately $(n+1):(n-1)$, and
the composition ratio of the first and second polymers at the second region of the guide layer is approximately $(m-1):(m+1)$.

20. The method for manufacturing the semiconductor device of claim 11,
wherein the guide layer includes a plurality of the first regions and a plurality of the second regions alternately disposed on the substrate.

* * * * *